United States Patent
Felker et al.

(10) Patent No.: US 8,912,025 B2
(45) Date of Patent: Dec. 16, 2014

(54) METHOD FOR MANUFACTURE OF BRIGHT GAN LEDS USING A SELECTIVE REMOVAL PROCESS

(75) Inventors: Andrew J. Felker, Livermore, CA (US); Rafael L. Aldaz, Pleasanton, CA (US); Max Batres, Oakland, CA (US)

(73) Assignee: Soraa, Inc., Fremont, CA (US)

( * ) Notice: Subject to any disclaimer, the term of this patent is extended or adjusted under 35 U.S.C. 154(b) by 494 days.

(21) Appl. No.: 13/304,182

(22) Filed: Nov. 23, 2011

(65) Prior Publication Data

US 2012/0135553 A1 May 31, 2012

(51) Int. Cl.
*H01L 21/00* (2006.01)
*B23K 26/40* (2014.01)
*B23K 26/36* (2014.01)
*H01L 33/00* (2010.01)

(52) U.S. Cl.
CPC .......... *H01L 33/0095* (2013.01); *B23K 26/409* (2013.01); *B23K 26/367* (2013.01)
USPC ............... 438/33; 438/38; 438/113; 438/115; 438/460; 257/E33.055

(58) Field of Classification Search
None
See application file for complete search history.

(56) References Cited

U.S. PATENT DOCUMENTS

| | | |
|---|---|---|
| 4,065,688 A | 12/1977 | Thornton |
| 4,870,045 A | 9/1989 | Gasper et al. |
| 5,331,654 A | 7/1994 | Jewell et al. |
| 5,607,899 A | 3/1997 | Yoshida et al. |
| 5,632,812 A | 5/1997 | Hirabayashi |
| 5,764,674 A | 6/1998 | Hibbs-Brenner et al. |
| 5,813,753 A | 9/1998 | Vriens et al. |
| 6,335,771 B1 | 1/2002 | Hiraishi |
| 6,468,882 B2 | 10/2002 | Motoki et al. |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,680,959 B2 | 1/2004 | Tanabe et al. |
| 6,734,461 B1 | 5/2004 | Shiomi et al. |
| 6,809,781 B2 | 10/2004 | Setlur et al. |
| 6,855,959 B2 | 2/2005 | Yamaguchi et al. |
| 6,956,246 B1 | 10/2005 | Epler et al. |
| 7,009,199 B2 | 3/2006 | Hall |
| 7,012,279 B2 | 3/2006 | Wierer, Jr. et al. |
| 7,128,849 B2 | 10/2006 | Setlur et al. |

(Continued)

FOREIGN PATENT DOCUMENTS

| | | |
|---|---|---|
| EP | 2381490 | 10/2011 |
| JP | 06-334215 | 12/1994 |

(Continued)

OTHER PUBLICATIONS

Notice of Allowance for U.S. Appl. No. 12/720,593 dated Jul. 11, 2012.

(Continued)

*Primary Examiner* — Calvin Choi
(74) *Attorney, Agent, or Firm* — Kilpatrick Townsend & Stockton LLP (57) ABSTRACT

A method of fabricating LED devices includes using a laser to form trenches between the LEDs and then using a chemical solution to remove slag creating by the laser.

13 Claims, 9 Drawing Sheets

(56) References Cited

U.S. PATENT DOCUMENTS

| | | | |
|---|---|---|---|
| 7,208,096 B2 | 4/2007 | Akkipeddi et al. |
| 7,285,801 B2 | 10/2007 | Eliashevich et al. |
| 7,303,630 B2 | 12/2007 | Motoki et al. |
| 7,341,880 B2 | 3/2008 | Erchak et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,938 B2 | 12/2008 | Lee et al. |
| 7,483,466 B2 | 1/2009 | Uchida et al. |
| 7,489,441 B2 | 2/2009 | Scheible et al. |
| 7,491,984 B2 | 2/2009 | Koike et al. |
| 7,535,082 B2 | 5/2009 | Nakayama et al. |
| 7,550,305 B2 | 6/2009 | Yamagata et al. |
| 7,598,104 B2 | 10/2009 | Teng et al. |
| 7,622,742 B2 | 11/2009 | Kim et al. |
| 7,718,454 B2 | 5/2010 | Nakamura et al. |
| 7,733,571 B1 | 6/2010 | Li |
| 7,786,488 B2 | 8/2010 | Nakayama et al. |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,897,988 B2 | 3/2011 | Chen et al. |
| 7,923,741 B1 | 4/2011 | Zhai et al. |
| 8,008,165 B2 | 8/2011 | Nakayama et al. |
| 8,044,412 B2 | 10/2011 | Murphy et al. |
| 8,142,566 B2 | 3/2012 | Kiyomi et al. |
| 8,143,148 B1 | 3/2012 | Raring et al. |
| 8,148,180 B2 | 4/2012 | Felker et al. |
| 8,153,475 B1 | 4/2012 | Shum et al. |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,268,643 B2 | 9/2012 | Matsumoto |
| 8,293,551 B2 | 10/2012 | Sharma et al. |
| 8,299,473 B1 | 10/2012 | D'Evelyn et al. |
| 8,310,143 B2 | 11/2012 | Van De Ven et al. |
| 8,313,964 B2 | 11/2012 | Sharma et al. |
| 8,314,429 B1 | 11/2012 | Raring et al. |
| 8,350,273 B2 | 1/2013 | Vielemeyer |
| 8,389,305 B2 | 3/2013 | Felker et al. |
| 8,431,942 B2 | 4/2013 | Butterworth |
| 8,455,894 B1 | 6/2013 | D'Evelyn et al. |
| 8,502,465 B2 | 8/2013 | Katona et al. |
| 8,524,578 B1 | 9/2013 | Raring et al. |
| 8,575,728 B1 | 11/2013 | Raring et al. |
| 8,597,967 B1 | 12/2013 | Krames et al. |
| 8,686,431 B2 | 4/2014 | Batres et al. |
| 2001/0009134 A1 | 7/2001 | Kim et al. |
| 2001/0043042 A1 | 11/2001 | Murazaki et al. |
| 2001/0055208 A1 | 12/2001 | Kimura |
| 2002/0028564 A1 | 3/2002 | Motoki et al. |
| 2002/0070416 A1 | 6/2002 | Morse et al. |
| 2002/0096994 A1 | 7/2002 | Iwafuchi et al. |
| 2002/0127824 A1* | 9/2002 | Shelton et al. ............ 438/463 |
| 2002/0155691 A1 | 10/2002 | Lee et al. |
| 2002/0182768 A1 | 12/2002 | Morse et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0047076 A1 | 3/2003 | Liu |
| 2003/0164507 A1 | 9/2003 | Edmond et al. |
| 2003/0178617 A1 | 9/2003 | Appenzeller et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0207998 A1 | 10/2004 | Suehiro et al. |
| 2004/0245543 A1* | 12/2004 | Yoo ........................ 257/103 |
| 2004/0251471 A1 | 12/2004 | Dwilinski et al. |
| 2005/0087753 A1 | 4/2005 | D'Evelyn et al. |
| 2005/0109240 A1 | 5/2005 | Maeta et al. |
| 2005/0121679 A1 | 6/2005 | Nagahama et al. |
| 2005/0167680 A1 | 8/2005 | Shei et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0263791 A1 | 12/2005 | Yanagihara et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0079082 A1 | 4/2006 | Bruhns et al. |
| 2006/0097278 A1 | 5/2006 | Goto et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0186418 A1* | 8/2006 | Edmond et al. .............. 257/79 |
| 2006/0189098 A1 | 8/2006 | Edmond |
| 2006/0204865 A1 | 9/2006 | Erchak et al. |
| 2006/0205199 A1 | 9/2006 | Baker et al. |
| 2006/0214287 A1 | 9/2006 | Ogihara et al. |
| 2006/0240585 A1 | 10/2006 | Epler et al. |
| 2006/0255343 A1 | 11/2006 | Ogihara et al. |
| 2006/0256482 A1 | 11/2006 | Araki et al. |
| 2006/0272572 A1 | 12/2006 | Uematsu et al. |
| 2006/0273339 A1 | 12/2006 | Steigerwald et al. |
| 2006/0286695 A1 | 12/2006 | Yanashima et al. |
| 2007/0045200 A1 | 3/2007 | Moon et al. |
| 2007/0093073 A1 | 4/2007 | Farrell et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0202624 A1 | 8/2007 | Yoon et al. |
| 2007/0210074 A1 | 9/2007 | Maurer et al. |
| 2007/0228404 A1 | 10/2007 | Tran et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0081015 A1 | 4/2008 | Sarayama et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0121916 A1 | 5/2008 | Teng et al. |
| 2008/0128752 A1 | 6/2008 | Wu |
| 2008/0142781 A1 | 6/2008 | Lee |
| 2008/0151543 A1 | 6/2008 | Wang |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0194054 A1 | 8/2008 | Lin et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0303033 A1 | 12/2008 | Brandes |
| 2009/0065798 A1 | 3/2009 | Masui et al. |

(56) References Cited

U.S. PATENT DOCUMENTS

| | | |
|---|---|---|
| 2009/0072252 A1 | 3/2009 | Son et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0146170 A1 | 6/2009 | Zhong et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0315965 A1 | 12/2009 | Yamagata et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0032691 A1 | 2/2010 | Kim |
| 2010/0055819 A1 | 3/2010 | Ohba et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0148145 A1 | 6/2010 | Ishibashi et al. |
| 2010/0155746 A1 | 6/2010 | Ibbetson et al. |
| 2010/0195687 A1 | 8/2010 | Okamoto et al. |
| 2010/0200837 A1 | 8/2010 | Zimmerman et al. |
| 2010/0220262 A1 | 9/2010 | DeMille et al. |
| 2010/0240158 A1 | 9/2010 | Ter-Hovhannissian |
| 2010/0290208 A1 | 11/2010 | Pickard |
| 2010/0295088 A1 | 11/2010 | D'Evelyn et al. |
| 2010/0309943 A1 | 12/2010 | Chakraborty et al. |
| 2010/0327291 A1 | 12/2010 | Preble et al. |
| 2011/0017298 A1 | 1/2011 | Lee |
| 2011/0056429 A1 | 3/2011 | Raring et al. |
| 2011/0057205 A1 | 3/2011 | Mueller et al. |
| 2011/0075694 A1 | 3/2011 | Yoshizumi et al. |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0121331 A1 | 5/2011 | Simonian et al. |
| 2011/0124139 A1 | 5/2011 | Chang |
| 2011/0175200 A1 | 7/2011 | Yoshida |
| 2011/0180781 A1 | 7/2011 | Raring et al. |
| 2011/0182056 A1 | 7/2011 | Trottier et al. |
| 2011/0186860 A1 | 8/2011 | Enya et al. |
| 2011/0186874 A1 | 8/2011 | Shum |
| 2011/0216795 A1 | 9/2011 | Hsu et al. |
| 2011/0266552 A1 | 11/2011 | Tu et al. |
| 2011/0279054 A1 | 11/2011 | Katona et al. |
| 2011/0281422 A1 | 11/2011 | Wang et al. |
| 2011/0309373 A1 | 12/2011 | Sharma et al. |
| 2011/0315999 A1 | 12/2011 | Sharma et al. |
| 2011/0317397 A1 | 12/2011 | Trottier et al. |
| 2012/0007102 A1 | 1/2012 | Feezell et al. |
| 2012/0104412 A1 | 5/2012 | Zhong et al. |
| 2012/0178198 A1 | 7/2012 | Raring et al. |
| 2012/0187412 A1 | 7/2012 | D'Evelyn et al. |
| 2012/0199841 A1 | 8/2012 | Batres et al. |
| 2012/0288974 A1 | 11/2012 | Sharma et al. |
| 2013/0022758 A1 | 1/2013 | Trottier |
| 2013/0026483 A1 | 1/2013 | Sharma et al. |
| 2013/0044782 A1 | 2/2013 | Raring |
| 2013/0112987 A1 | 5/2013 | Fu et al. |
| 2013/0126902 A1 | 5/2013 | Isozaki et al. |
| 2013/0234108 A1 | 9/2013 | David et al. |
| 2014/0103356 A1 | 4/2014 | Krames et al. |

FOREIGN PATENT DOCUMENTS

| | | |
|---|---|---|
| JP | 1997-082587 | 3/1997 |
| JP | 1999-340507 | 12/1999 |
| JP | 1999-340576 | 12/1999 |
| JP | 2001-177146 | 6/2001 |
| JP | 2003-031844 | 1/2003 |
| JP | 2007-110090 | 4/2007 |
| JP | 2008-084973 | 4/2008 |
| JP | 2008-172040 | 7/2008 |
| WO | WO 2006/062880 | 6/2006 |
| WO | WO 2009/001039 | 12/2008 |

OTHER PUBLICATIONS

Office Action for U.S. Appl. No. 12/861,765 dated Jul. 2, 2012.
Office Action for U.S. Appl. No. 12/936,238 dated Aug. 30, 2012.
Notice of Allowance for U.S. Appl. No. 13/163,482 dated Jul. 31, 2012.
Notice of Allowance for U.S. Appl. No. 13/163,498 dated Jul. 23, 2012.
Office Action for U.S. Appl. No. 13/465,976 dated Aug. 16, 2012.
Cich et al., 'Bulk GaN based violet light-emitting diodes with high efficiency at very high current density', Applied Physics Letters, Nov. 29, 2012, pp. 223509-1-223509-3.
Office Action for U.S. Appl. No. 12/749,476 dated Apr. 11, 2011.
Office Action for U.S. Appl. No. 12/749,476 dated Nov. 8, 2011.
Notice of Allowance for U.S. Appl. No. 12/749,476 dated May 4, 2012.
Notice of Allowance for U.S. Appl. No. 12/749,476 dated Jun. 26, 2012.
Office Action for U.S. Appl. No. 12/880,889 dated Sep. 19, 2012.
Notice of Allowance for U.S. Appl. No. 13/419,325 dated Dec. 4, 2012.
Aguilar, 'Ohmic n-contacts to Gallium Nitride Light Emitting Diodes', National Nanotechnoloy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, p. L920-L922.
Founta et al., 'Anisotropic Morphology of Nonpolar a-Plane GaN Quantum Dots and Quantum Wells', Journal of Applied Physics, vol. 102, vol. 7, 2007, p. 074304-1-074304-6.
Haskell et al., 'Defect Reduction in (1100) m-plane gallium nitride via lateral epitaxial overgrowth by hydride vapor phase epitaxy', Applied Physics Letters 86, 111917, 2005, p. 1-3.
Lu et al., 'Etch-Pits of GaN Films with Different Etching Methods', Journal of the Korean Physical Society, vol. 45, Dec. 2004, p. S673-S675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, p. 57-60.
Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Communication from the Japanese Patent Office re 2012-529969, dated Oct. 15, 2013, (6 pages).
Weaver et al., 'Optical Properties of Selected Elements', Handbook of Chemistry and Physics, 94th Edition, 2013-2014, p. 12-126-12-150.
Office Action for U.S. Appl. No. 12/491,169 dated Oct. 22, 2010 (9 pages).
Office Action for U.S. Application No. 12/491,169 dated May 11, 2011 (9 pages).

(56) References Cited

OTHER PUBLICATIONS

Office Action for U.S. Appl. No. 12/497,289 dated Feb. 2, 2012 (6 pages).
Notice of Allowance for U.S. Appl. No. 12/497,289 dated May 22, 2012 (7 pages).
Office Action for U.S. Appl. No. 12/785,953 dated Apr. 12, 2012 (11 pages).
Office Action for U.S. Appl. No. 12/785,953 dated Jan. 11, 2013 (14 pages).
Office Action for U.S. Appl. No. 12/785,953 dated Oct. 3, 2013 (10 pages).
Office Action for U.S. Appl. No. 12/880,803 dated Feb. 22, 2012 (8 pages).
Notice of Allowance for U.S. Appl. No. 12/880,803 dated Jul. 18, 2012 (5 pages).
Office Action for U.S. Appl. No. 12/995,946 dated Jan. 29, 2013 (25 pages).
Office Action for U.S. Appl. No. 12/995,946 dated Aug. 2, 2013 (15 pages).
Office Action for U.S. Appl. No. 13/019,897 dated Dec. 2, 2013 (17 pages).
Notice of Allowance for U.S. Appl. No. 13/281,221 dated Nov. 12, 2013 (10 pages).
Office Action for U.S. Appl. No. 13/328,978 dated Sep. 26, 2013 (25 pages).
Office Action for U.S. Appl. No. 13/548,635 dated Jun. 14, 2013 (5 pages).
Notice of Allowance for U.S. Appl. No. 13/548,635 dated Sep. 16, 2013 (6 pages).
Notice of Allowance for U.S. Appl. No. 13/548,770 dated Jun. 25, 2013 (6 pages).
Office Action for U.S. Appl. No. 13/629,366 dated Oct. 31, 2013 (7 pages).
Office Action for U.S. Appl. No. 13/723,968 dated Nov. 29, 2013 (23 pages).
Motoki et al., 'Dislocation reduction in GaN crystal by advanced-DEEP', Journal of Crystal Growth, vol. 305, Apr. 1, 2007, pp. 377-383.
Communication from the Japanese Patent Office re 2013515583 dated Feb. 27, 2014, 2 pages.
Office Action for U.S. Appl. No. 12/569,841 dated Feb. 14, 2014, 20 pages.
Office Action for U.S. Appl. No. 13/012,674 dated Jan. 17, 2014, 15 pages.
Office Action for U.S. Appl. No. 13/491,483 dated Jan. 16, 2014, 9 pages.
Office Action for U.S. Appl. No. 12/481,543 dated Jun. 27, 2011.
Office Action for U.S. Appl. No. 12/634,665 dated Mar. 12, 2012.
Office Action for U.S. Appl. No. 12/858,379 dated Apr. 14, 2011.
Notice of Allowance for U.S. Appl. No. 12/858,379 dated Dec. 6, 2011.
Office Action for U.S. Appl. No. 12/879,784 dated Jan. 25, 2012.
Notice of Allowance for U.S. Appl. No. 12/879,784 dated Apr. 3, 2012.
Office Action for U.S. Appl. No. 12/880,889 dated Feb. 27, 2012.
Office Action for U.S. Appl. No. 12/995,946 dated Mar. 28, 2012.
Office Action for U.S. Appl. No. 13/014,622 dated Nov. 28, 2011.
Office Action for U.S. Appl. No. 13/014,622 dated Apr. 30, 2012.
Office Action for U.S. Appl. No. 13/019,897 dated Mar. 30, 2012.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Communication from the Korean Patent Office re 10-2012-7009980, dated Apr. 15, 2013.
Office Action for U.S. Appl. No. 12/569,841 dated Mar. 26, 2013.
Office Action for U.S. Appl. No. 12/749,466 dated Jul. 3, 2012.
Notice of Allowance for U.S. Appl. No. 12/936,238 dated Apr. 16, 2013.
Office Action for U.S. Appl. No. 13/019,897 dated Jan. 16, 2013.
Office Action for U.S. Appl. No. 13/328,978 dated May 15, 2013.
Office Action for U.S. Appl. No. 13/465,976 dated Dec. 20, 2012.
Notice of allowance for U.S. Appl. No. 13/184,160 (Dec. 12, 2011).
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Hanifin et al., 'Photoreception for Circadian, Neuroendocrine, and Neurobehavioral Regulation', Journal of Physiological Anthropology, vol. 26, 2007, pp. 87-94.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
Office Action for U.S. Appl. No. 12/569,841 dated Aug. 13, 2013, 21 pages.
Office Action for U.S. Appl. No. 12/861,765 dated Sep. 17, 2013, 10 pages.
Office Action for U.S. Appl. No. 13/281,221 dated Jun. 21, 2013, 6 pages.
Notice of Allowance for U.S. Appl. No. 13/298,617 dated Sep. 13, 2013, 12 pages.
Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.
Office Action for U.S. Appl. No. 12/569,841 dated Dec. 23, 2011.
Office Action for U.S. Appl. No. 12/569,844 dated Oct. 12, 2012.
Notice of Allowance for U.S. Appl. No. 12/569,844 dated Mar. 7, 2013.
Notice of Allowance for U.S. Appl. No. 12/754,886 dated May 17, 2012.
Notice of Allowance for U.S. Appl. No. 12/754,886 dated Jun. 5, 2012.
Notice of Allowance for U.S. Appl. No. 12/754,886 dated Jun. 20, 2012.
Office Action for U.S. Appl. No. 12/861,765 dated Mar. 7, 2013.
Office Action for U.S. Appl. No. 12/936,238 dated Jan. 30, 2013.
Office Action for U.S. Appl. No. 13/025,833 dated Jul. 12, 2012.
Office Action for U.S. Appl. No. 13/179,346 dated Aug. 17, 2012.
Office Action for U.S. Appl. No. 13/179,346 dated Dec. 13, 2012.
Notice of Allowance for U.S. Appl. No. 13/419,325 dated Feb. 1, 2013.
Office Action for U.S. Appl. No. 13/425,354 dated Feb. 14, 2013.
Notice of Allowance for U.S. Appl. No. 12/785,953 dated Mar. 20, 2014 (8 pages).
Office Action for U.S. Appl. No. 12/861,765 dated Mar. 28, 2014 (12 pages).
Notice of Allowance for U.S. Appl. No. 13/012,674 dated Apr. 30, 2014 (8 pages).
Office Action for U.S. Appl. No. 13/019,897 dated Jun. 12, 2014 (8 pages).
Office Action for U.S. Appl. No. 13/357,578 dated May 13, 2014 (8 pages).
Office Action for U.S. Appl. No. 13/629,366 dated Apr. 18, 2014 (7 pages).
Office Action for U.S. Appl. No. 13/904,237 dated May 22, 2014 (13 pages).

* cited by examiner

METHOD FOR MANUFACTURE OF BRIGHT GAN LEDS USING A SELECTIVE REMOVAL PROCESS

BACKGROUND OF THE INVENTION

The present invention generally relates to semiconductor processes and, more particularly, to a method for singulating die from a wafer in furtherance of fabricating light emitting diodes.

Although saw dicing has traditionally been effectively used for singulating dice it has given way to singulation processes employing different methods. For example the laser has replaced the mechanical saw to avoid the deleterious effects of vibration and particulate contaminates generated by saw dicing. Edge defects that often occurred as a result of saw dicing are avoided, as are micro-cracks.

Laser cutting may be employed with a cleaving process such that the laser is used to form a trench in the wafer, but does not cut completely through the wafer. A cleaving process is implemented to complete the singulation process after formation of the trench. Often the laser cutting process leaves a residue on the die formed from the singulation process. The residue may prove problematic to the desired operation of optical semiconductor dice, such as light emitting diodes. These and other limitations may be exist with the conventional cleaving process.

Accordingly, it is desirable to provide an improved method for singulating dice.

BRIEF SUMMARY OF THE INVENTION

This invention provides techniques for manufacturing high brightness optical devices. More particularly, the method provides a processing method for removing slag material to enhance light output and efficiency of light emitting diodes, commonly termed LEDs.

The invention provides a manufacturing method for light emitting diode devices. The manufacturing method includes a technique for singulating dice from a substrate, e.g., a sapphire substrate or bulk gallium nitride. The method includes providing the substrate having a thickness of gallium and nitrogen containing material. Preferably, the substrate includes a plurality of die, with each die providing an LED device. The method also includes forming trenches by scanning a coherent beam of energy in a repetitive manner to respective portions of the surface. The scanned coherent beam, preferably derived from a laser, causes ablation of selected materials of the surface. The trenches extend from the surface of the substrate toward an opposing surface, without separating the die. The die may be held together by a thickness of adhesive material or a remaining thickness of the substrate. The trenches can be of desired shape, e.g., v-shaped.

The method causes formation of slag material along the trenches during their formation. The method also subjects the trenches and the slag to a chemical solution to selectively remove the slag without significantly changing the cross-section of the trenches. The chemical is preferably a potassium hydroxide solution, a potassium ferricyanide solution, or a hydrochloric acid solution, or combinations of them. Preferably, the chemical solution is a buffered potassium ferricyanide solution.

The method may further include increasing the temperature of the chemical solution from approximately 50° C. to a temperature below the boiling point of the solution. The die may then be broken apart. The method also includes mounting the substrates to a flexible adhesive thickness of material from which they are later removed.

In a specific embodiment, the invention provides a method which includes forming a plurality of trenches by scanning a coherent beam of energy in a repetitive manner across respective portions of the surface regions. Each of the trenches extends from the surface of the semiconductor substrate toward an opposing surface. Slag is formed along the trenches, but is later removed by subjecting the trenches and the slag to a chemical solution. The chemical solution comprises a potassium hydroxide solution, a potassium ferricyanide solution, or a hydrochloric acid solution. Upon completion each of the die is substantially free from slag.

The chemical solution has certain preferably characteristics. As an example, the potassium hydroxide solution consists of 45% potassium hydroxide by weight and 55% water by weight. The potassium ferricyanide solution consists of potassium hexacyanoferrate in a range of 30% to 40% by weight, potassium hydroxide in a range of 1% to 5% by weight and water in a range of 55%-69% by weight. The method also includes heating the hydrochloric acid solution to approximately 65° C. The hydrochloric acid solution consists of about 35% hydrochloric acid by weight and 65% water by weight.

The present method provides for a high efficiency bright light emitting diode device, e.g. with 100 lumens per Watt output. Preferably, the method maintains the shape of each of the trenches to within about 98% of their original shape even after removing the slag. That is, there is less than 2% and preferably less than 1% removal of the gallium and nitrogen containing material. Depending upon the embodiment, the present method achieves over a 100% increase in light output compared to no removal of the slag.

DETAILED DESCRIPTION OF THE INVENTION

Figure 1:
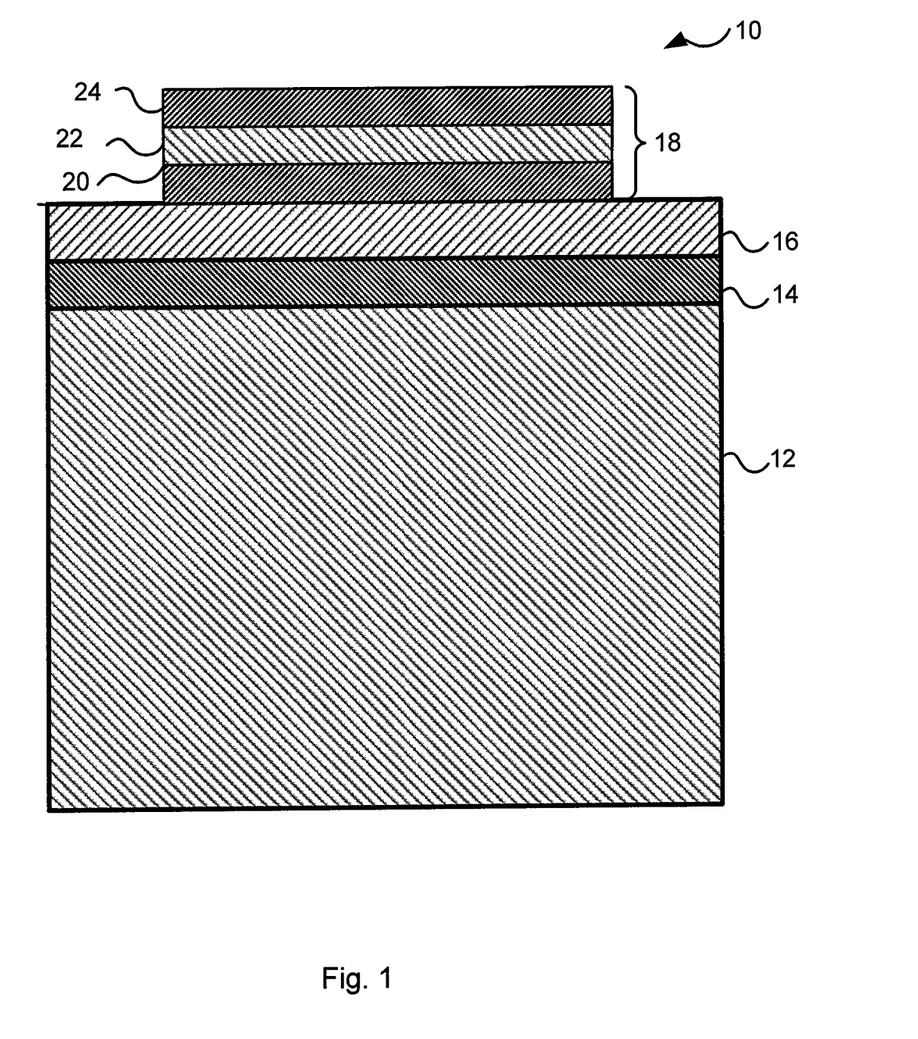
FIG. 1 is a cross-sectional view of a single light emitting diode.

FIG. 1 shows a light emitting diode 10 on a substrate 12 of n-type gallium nitride GaN manufactured. An active layer 14 is formed upon substrate. Active layer 14 may comprise a single quantum well or multiple quantum wells, e.g. 2-10 quantum wells. A layer of p-type gallium nitride 16 is formed upon quantum wells 14, and a metal stack 18 is positioned upon layer 16. The stack is formed of three separate metal layers 20, 22 and 24. Layers 20 and 24 are platinum and layer 22 is silver.

Substrate 12 may have a large-surface orientation between ten degrees and 0.2 degree (or less) of (0 0 0 1), (0 0 0 −1), {1 −1 0 0}, {1 1 −2 0}, {1 −1 0.+−.1}, {1 −1 0.+−.2}, {1 −1 0.+−.3}, {2 0−2.+−.1}, or {1 1 −2.+−.2}. In one embodiment, the substrate has a semipolar large-surface orientation, designated by (hkil) Bravais-Miller indices, where i=−(h+k), 1 is nonzero and at least one of h and k are nonzero. The substrate preferably has a dislocation density below $10^4$ $cm^2$ and an optical absorption coefficient below 100 $cm^{10}-1$ at wavelengths between about 465 nm and about 700 nm. The nitride base crystal has an optical absorption coefficient below 100 $cm^{-1}$ at wavelengths between about 700 nm and about 6667 nm. The surface of substrate 12 has a dislocation density below $10^5$ $cm^{-2}$ and is substantially free of low-angle grain boundaries, or tilt boundaries, over a length scale of at least 3 millimeters. The substrate 12 may be doped with any suitable n-type dopants from group VI and group IV atoms, e.g., sulfur, selenium, tellurium, silicon, germanium. In the present embodiment, substrate 12 is doped with Si and O providing a dopant concentration of approximately of 3 E18 cm-3.

Active layer 14 preferably comprises InGaN wells and GaN barrier layers. In other embodiments, the well layers and barrier layers comprise AlwInxGa1-w-xN and AlyInzGa1-y-zN, respectively, where 0≤w,x,y,z,w+x,y+z≤1, where w<u,y and/or x>v,z so that the bandgap of the well layer(s) is less than that of the barrier layer(s) and the n-type substrate. The well layers and barrier layers each have a thickness between about 1 nm and about 20 nm. In another embodiment, active layer 14 comprises a double heterostructure, with an InGaN or AlwInxGa1-w-xN and AlyInzGa1-y-zN layer about 20 nm to about 500 nm thick surrounded by GaN or AlyInzGa1-y-zN layers, where w<u, y and/or x>v, z. The composition and structure of active layer 14 are chosen to provide light emission at a preselected wavelength. Active layer 14 may be left undoped (or unintentionally doped) or may be doped n-type or p-type. Active layer 14 is formed upon substrate 12 using standard processing techniques.

Layer 16 may be doped with any suitable p-type dopant, such as group II or IV atoms, e.g., magnesium, zinc, cadmium, silicon, and germanium. In the present example, layer is doped with magnesium to provide a dopant concentration of approximately 1e20 cm-3.

Figure 2:
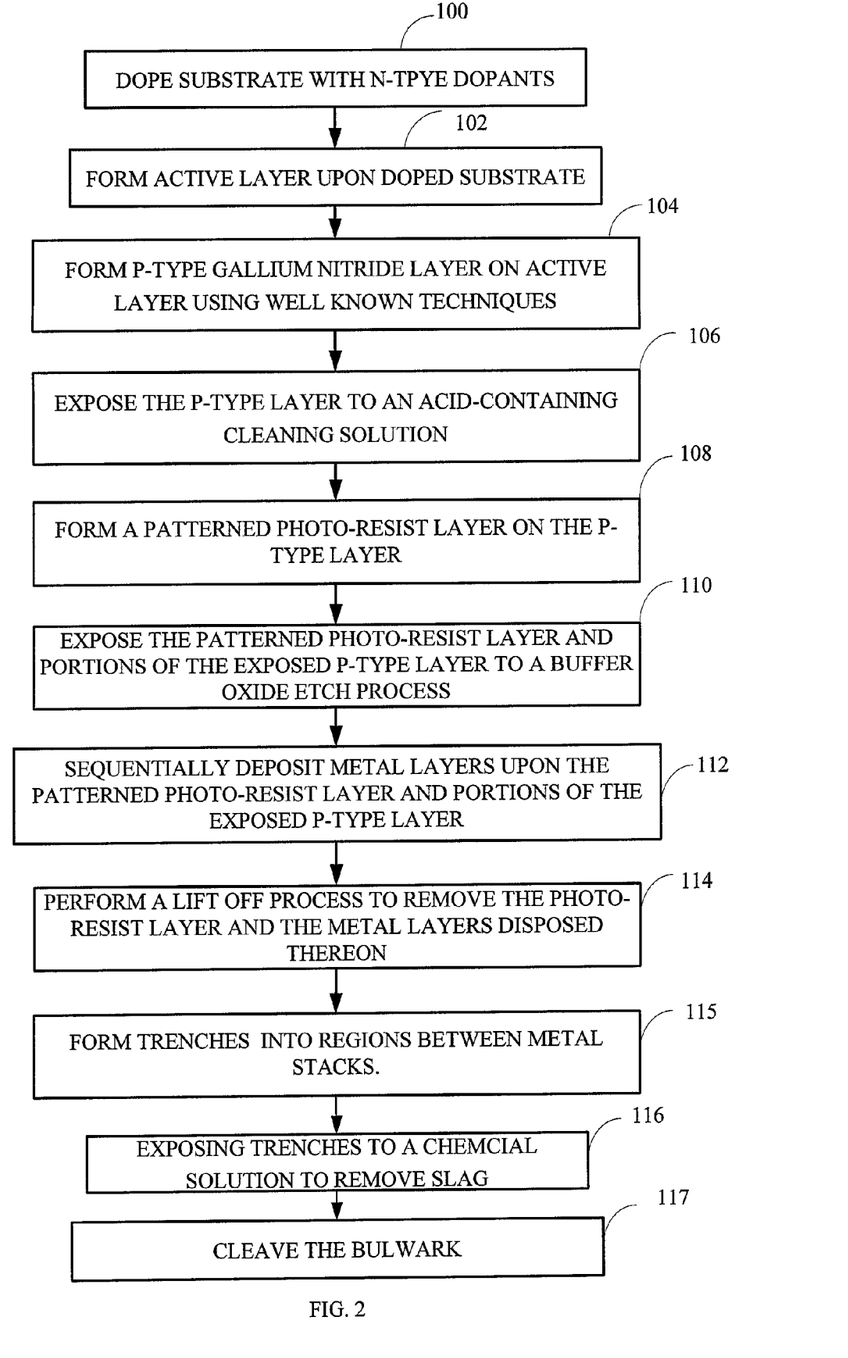
FIG. 2 is a flow diagram showing the steps used to manufacture the light emitting diode shown in FIG. 1.
Figure 3:
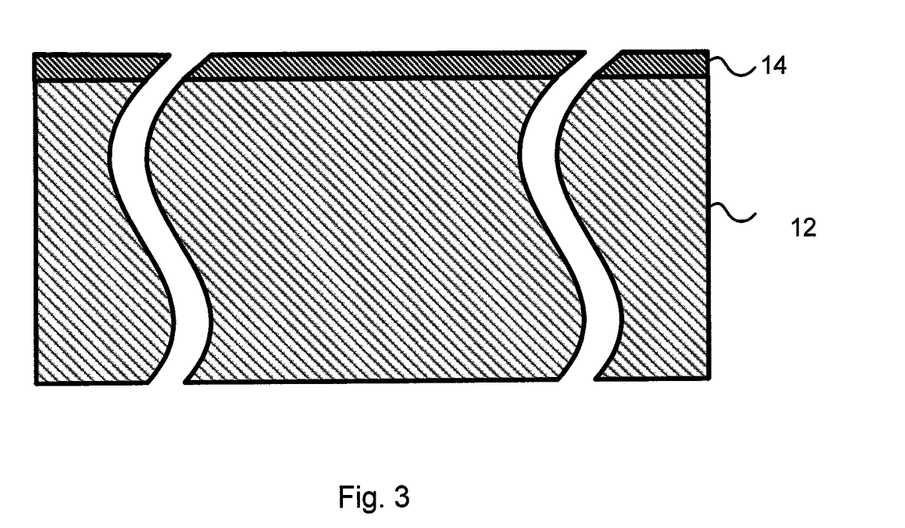
FIG. 3 is a cross-sectional view showing a substrate upon which the light emitting diode of FIG. 1 is produced.
Figure 4:
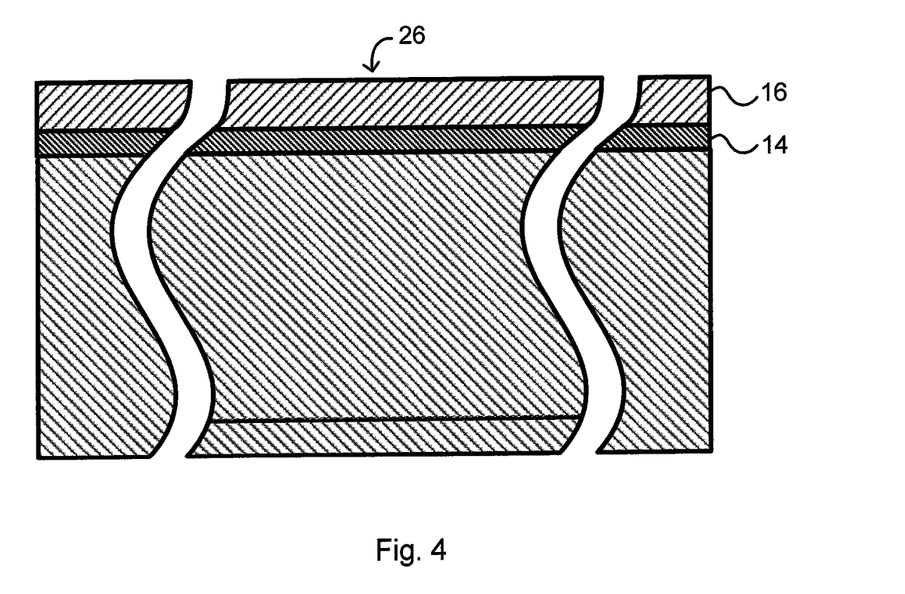
FIG. 4 is a cross-sectional view showing the substrate in FIG. 3 with a p-type gallium nitride layer thereon.

Referring to FIGS. 1, 2 and 3, during fabrication, light emitting diode 10 is fabricated concurrently with a plurality of other light emitting diodes on a common semiconductor wafer. Wafer 15 is doped with n-type dopants using known techniques, at step 100. At step 102, active layer 14 is formed upon wafer 15 using known techniques. Following formation of active layer 14, p-type gallium nitride layer 16 is formed thereupon, shown in FIG. 4, at step 104 of FIG. 2. At step 106 surface of layer is exposed to an acid-containing cleaning solution. The cleaning solution consists essentially of 15% of nitric acid by weight, 27% of hydrochloric acid by weight and 58% of water by weight. This provides cleaned surface 26.

Figure 5:
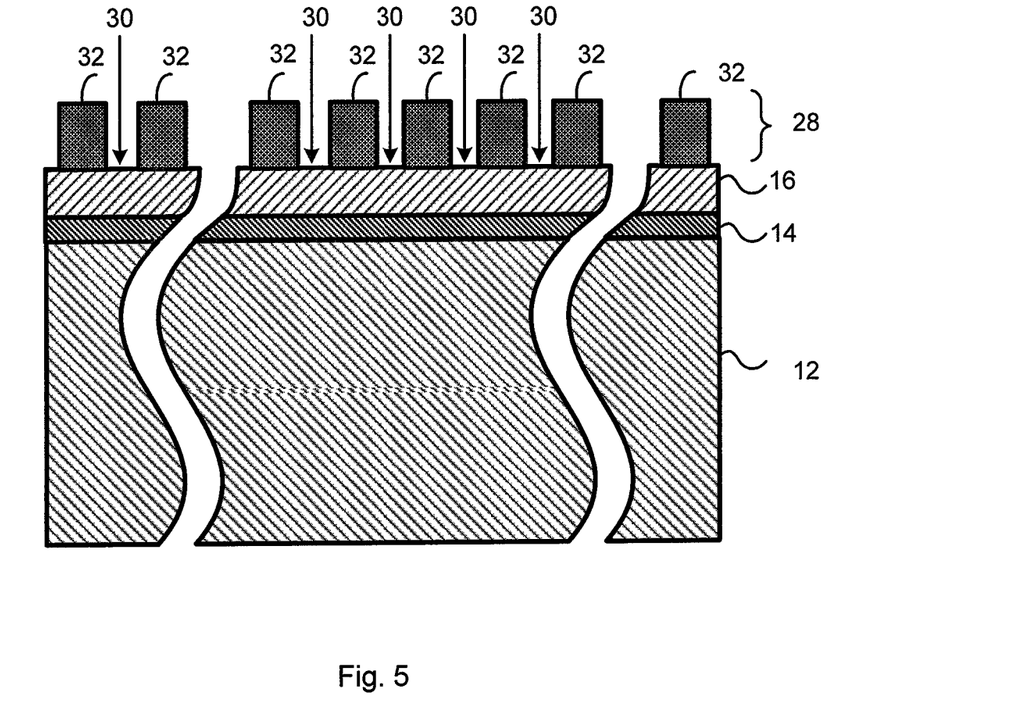
FIG. 5 is a cross-sectional view of the substrate shown in FIG. 4 having a patterned photoresist layer thereon.
Figure 6:
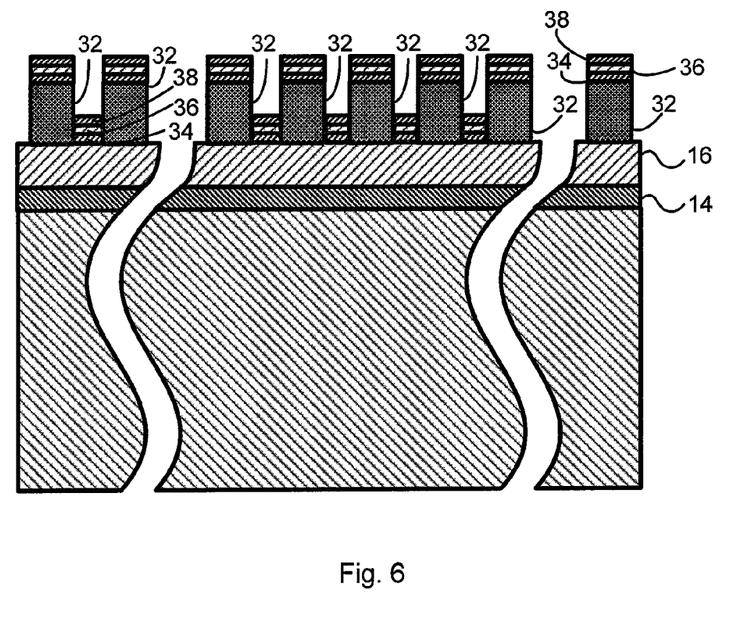
FIG. 6 is a cross-sectional view of the substrate shown in FIG. 4 having a plurality of metal layers thereon.

Referring to both FIG. 2 and FIG. 5, at step 108 a patterned photo resist layer 28 is formed upon cleaned surface 26. Layer 28 has a shape of a battlement leaving portions 30 of cleaned surface 26, with segments 32 of photo resist material being present between adjacent portions 30. Following formation of patterned photo resist layer 28, wafer 15 regions 30 and segments 32 are exposed to a buffered oxide etch process, at step 110. To that end, wafer 15 dipped into a solution consisting essentially of 2% hydrofluoric acid by weight and 8.75% ammonium fluoride by weight, with the rest being water. At step 112, three metal layers are sequentially deposited upon portions and segments 32. Specifically, a platinum layer 34 is deposited, followed by deposition of a silver layer 36. Another platinum layer 38 is deposited upon silver layer 36.

Figure 7:
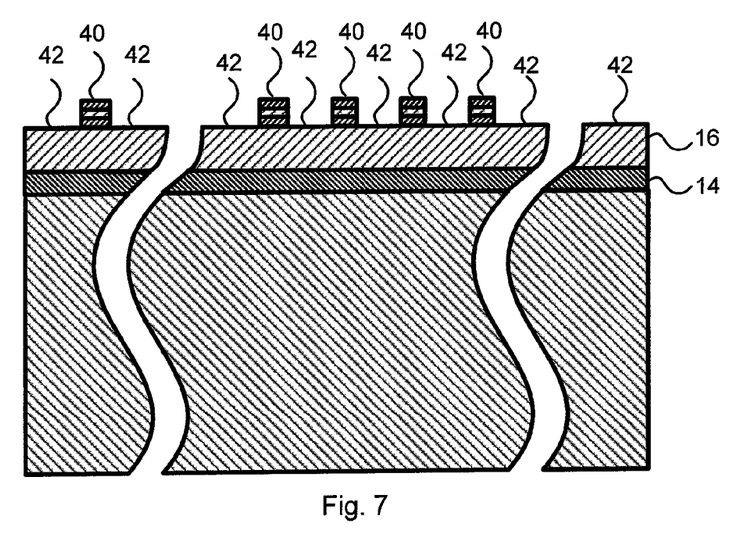
FIG. 7 is a cross-section view of the substrate shown in FIG. 6 after a lift-off process.

Referring to FIG. 2, at step 114 a lift-off process is used to remove segments 32 and the portions of layers 34, 36 and 38 in superimposition therewith, leaving a plurality of spaced-apart metal stacks 40. As a result, regions 42, shown in FIG. 7, of exposed wafer 15 remain between the spaced-apart metal stacks 40.

Figure 8:
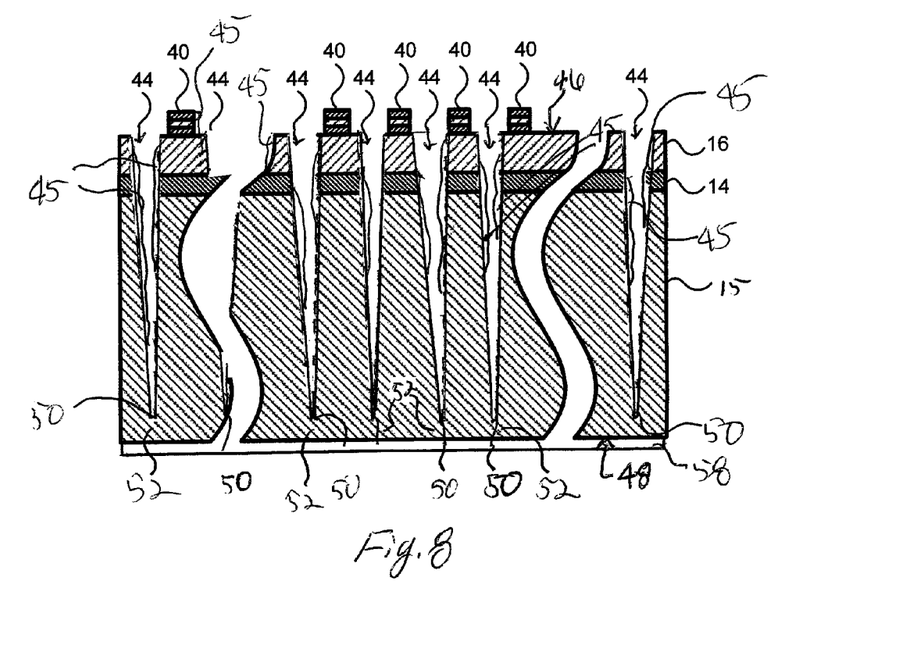
FIG. 8 is a cross-sectional view of the wafer shown in FIG. 6 with slag present.
Figure 9:
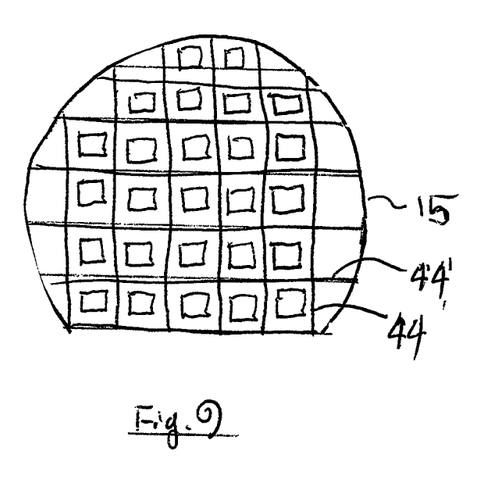
FIG. 9 is a top view of the wafer shown in FIG. 8.
Figure 10:
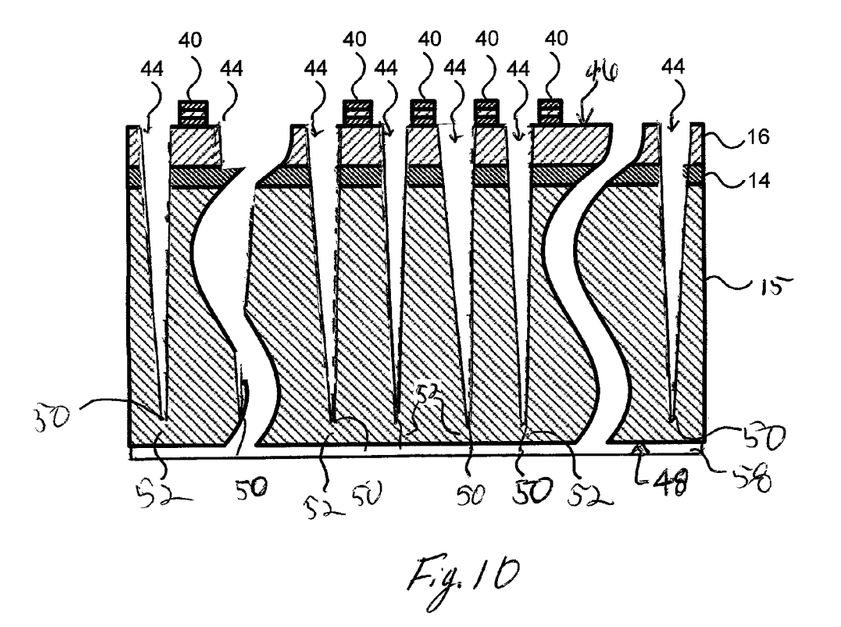
FIG. 10 is a cross-sectional view of the wafer shown in FIG. 8 after removal of slag.

Referring to both FIG. 2 and FIG. 8, at step 116, a trench 44 is formed in each regions 42, using desired techniques, such as laser etching using a coherent beam of energy in the ultra violet spectrum. It should be understood that a trench 44 is adjacent to each metal stack 40 and is positioned between each adjacent pair of metals stacks 40. As result, a plurality of trenches 44 are formed in wafer 15 to form a grid pattern, shown in FIG. 9. Referring again to FIG. 8, each trench 44 extends from surface 46 of wafer 15 toward an opposing surface 48. Each trench 44 includes a nadir 50 that is spaced-apart from surface 48, defining a bulwark 52. Bulwark 52 extends between nadir 50 and surface 48. After formation of trenches 44, bulwark 52 is cleaved using a three point bending technique to segment light emitting diode 10 from wafer 15, referred to as a die. Typically, all bulwarks 52 are subjected to the cleaving process concurrently so as to produce a plurality of dies. To assist in affixing the spatial location of each die after segmentation it is common to include a layer of flexible adhesive tape 58 upon surface 48.

A problem encountered with using laser etching is the creation of contaminants that remains on the light emitting diode 10, referred to as slag 45. Slag 45 includes gallium metal, GaNx and GaOx and causes reduced light output. Although slag 45 is shown primarily in trenches 44, in practice slag 45 may be present in virtually any region of wafer 15. To remove the slag, wafer 15 is subjected to a chemical solution at step 115. The chemic solution is selected from a set of solutions consisting essentially of a potassium hydroxide solution, a potassium ferricyanide solution and a hydrochloric acid solution. The potassium hydroxide solution consists of 45% of potassium hydroxide by weight and 55% water by weight. The potassium ferricyanide solution consists of potassium hexacyanoferrate in a range of 30% to 40% by weight, potassium hydroxide in a range of 1% to 5% by weight and water in a range of 55%-69% by weight; and the hydrochloric acid solution consists of 35% of hydrochloric acid by weight and 65% water by weight. It is desired that the hydrochloric acid solution is heated to approximately 65° C. in increase the efficacy of removing the slag. Although exposing wafer 15 to the chemical solution is done following formation of trenches 44, this may occur before or after cleaving of bulwark 52. As a result of exposure to chemical solution, slag 45 is removed from trenches 44 and the remaining portions of wafer. In another embodiment, it is possible to grow the quantum wells, scribe the wafer, dip the wafer in the chemicals to remove the slag, put down photo resist, deposit the metals, and then cleave the wafer.

Example

Figure 11:
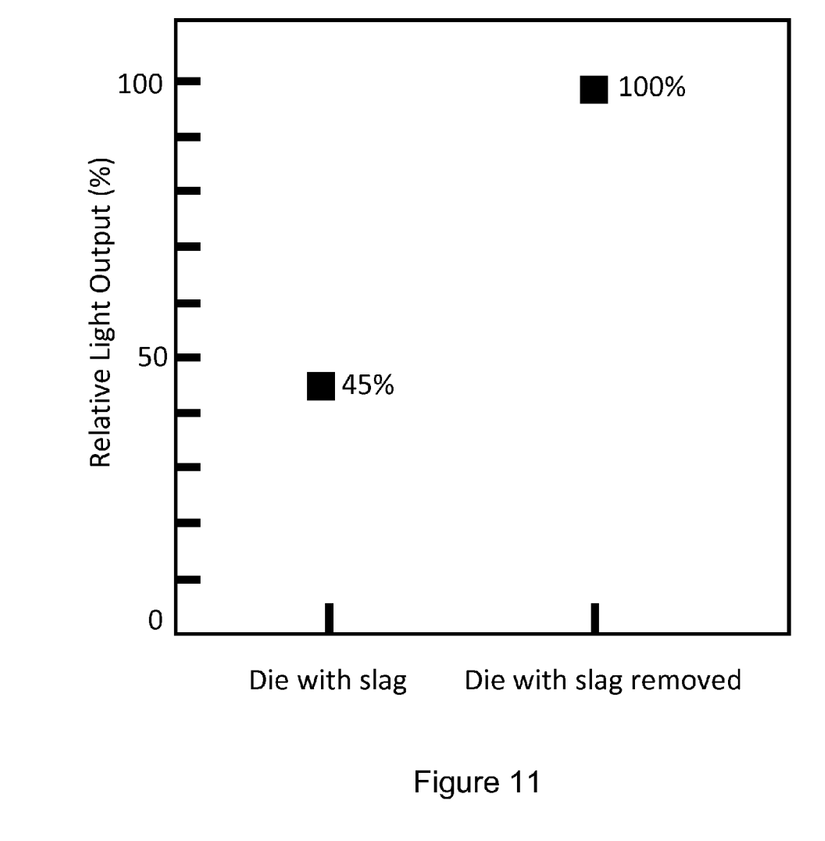
FIG. 11 is a diagram illustrating device performance.

To prove the principles and operation of the invention, certain experiments were performed. These experiments are merely examples of the process. In this example, gallium and nitrogen containing substrates with LED devices were fabricated. The substrates were subjected to scribing using a laser process. Scribing occurred at an energy density of ablation, i.e. 0.075 W/um². The laser process used a 6 um spot size 2.1 W laser with a 25 um pulse width set at 80 Khz. The ranges of laser output that the slag removal would work is from 400 nm to 200 nm with average power from 25 mw to 10 W. Preferably, the laser beam ablates a portion of the gallium and nitrogen containing material. After formation of the scribes and slag, removal occurred using potassium ferricyanide species in a solution including a potassium hexacyanoferrate in a range of 30% to 40% by weight, potassium hydroxide in a range of 1% to 5% by weight, and water in a range of 55%-69% by weight, which may be mixed and/or agitated, although is not required. The temperature of the solution ranges from about 60 to 75 degrees Celsius and is preferably about 65 degrees Celsius. Referring to FIG. 11, we achieved over a 100% improvement in relative light output once the slag was removed using the method of the invention. Also, the efficiency of conversion, commonly external quantum efficiency, exceeded 30% and is preferably about 40 to 50% and greater.

It should be understood that the description recited above is an example of the invention and that modifications and changes may be undertaken which are within the scope of the claimed invention. Therefore, the scope of the appended claims should be accorded the broadest interpretation so as to encompass all such modifications and similar arrangements, including a full scope of equivalents.

What is claimed is:

1. A method of manufacturing high brightness LED devices, the method of manufacturing comprising:
    providing a gallium and nitrogen substrate having a surface with a plurality of light emitting diodes;
    treating the substrate to form a plurality of trenches among the light emitting diodes, the plurality of trenches extending from the surface toward an opposing surface, by scanning a coherent beam of energy onto the surface wherein the step of treating causes formation of slag along the plurality of trenches; and
    subjecting the trenches and the slag to a chemical solution including potassium ferricyanide to substantially remove the slag without substantially changing the trenches,
    wherein the temperature of the chemical solution ranges from about 60 to 75 degrees Celsius, and the chemical solution comprises potassium hexacyanoferrate in a range of 30% to 40% by weight, potassium hydroxide in a range of 1% to 5% by weight, and water in a range of 55%-69% by weight.

2. The method of claim 1 wherein the substrate comprises GaN, the slag is formed overlying each of the trenches, and at least some trenches have a protruding portion of slag, the slag having a lower density than a density of the substrate.

3. The method of claim 1 further comprising separating the plurality of light emitting diodes from each other.

4. The method of claim 3 wherein the step of separating comprises breaking the substrate apart using the trenches.

5. The method of claim 4 further comprising;
    mounting the substrate to a flexible adhesive material prior to breaking the substrate apart, and
    removing the light emitting diodes from the flexible adhesive material after breaking the substrate apart.

6. The method of claim 1 further comprising heating the chemical solution to approximately 65° C.

7. A method of separating individual semiconductor die having light emitting diodes formed on a surface of a substrate, wherein the substrate comprises gallium nitride, the method comprising:
    forming a plurality of trenches in the substrate by scanning the substrate with a coherent beam of energy, the plurality of trenches extending from the surface of the substrate toward an opposing surface, the step of forming the plurality of trenches also forming slag along the plurality of trenches;
    subjecting the substrate, including the trenches and the slag, to a chemical solution to selectively remove substantially all of the slag without substantially changing the trenches; and
    separating the individual semiconductor die from each other,
    wherein the temperature of the chemical solution ranges from about 60 to 75 degrees Celsius, and the chemical solution consists of potassium hexacyanoferrate in a range of 30% to 40% by weight, potassium hydroxide in a range of 1% to 5% by weight and water in a range of 55%-69% by weight.

8. The method as recited in claim 7 further comprising heating the chemical solution to approximately 65° C.

9. The method as recited in claim 7 further comprising, after the step of forming the plurality of trenches, a step of mounting the substrate on a flexible adhesive layer.

10. A method of manufacturing light emitting diode (LED) devices, the method comprising:
    providing a sapphire substrate including a layer of material, the layer containing gallium and nitrogen and having a plurality of LEDs thereon;
    forming a plurality of trenches in at least the layer of material by scanning the substrate with a coherent beam of energy, thereby causing ablation of surface regions of the substrate and formation of slag along the plurality of trenches;
    subjecting the substrate, including the trenches and the slag, to a chemical solution to selectively remove the slag without substantially changing the trenches; and
    separating the plurality of LEDs from each other using the trenches,
    wherein the temperature of the chemical solution ranges from about 60 to 75 degrees Celsius, and the chemical solution comprises potassium hexacyanoferrate in a range of 30% to 40% by weight, potassium hydroxide in a range of 1% to 5% by weight and water in a range of 55%-69% by weight.

11. The method as recited in claim 10 wherein:
    an adhesive tape is affixed to a bottom surface of the substrate; and
    the LEDs are separated from each other by the trenches and then each LED is removed from the tape.

12. The method as recited in claim 10 further comprising heating the chemical solution to above about 65° C.

13. The method as recited in claim 10 wherein the plurality of trenches are formed using a pulsed laser.

* * * * *